United States Patent
Tabrez et al.

[11] Patent Number: 6,080,270
[45] Date of Patent: Jun. 27, 2000

[54] COMPACT MICROWAVE DOWNSTREAM PLASMA SYSTEM

[75] Inventors: M. Shams Tabrez, Fremont; Dwight C. Chew, San Ramon; Patrick J. Stafford, San Jose; Richard C. Riddle, Coto de Caza; Alexander S. Polyak, San Jose, all of Calif.

[73] Assignee: Lam Research Corporation, Fremont, Calif.

[21] Appl. No.: 08/892,610

[22] Filed: Jul. 14, 1997

[51] Int. Cl.[7] ............................... C23F 1/02; C23C 16/00
[52] U.S. Cl. ..................... 156/345; 118/723 ME
[58] Field of Search ................. 118/723 MW, 118/723 ME; 156/345; 315/111.21; 313/99 PL; 333/99 PL; 219/690, 694, 695, 696, 702

[56] References Cited

U.S. PATENT DOCUMENTS

| | | | |
|---|---|---|---|
| 5,449,412 | 9/1995 | Pinneo | 118/723 MP |
| 5,489,362 | 2/1996 | Steinhardt et al. | 156/643.1 |
| 5,803,975 | 9/1998 | Auzuki | 118/723 MW |

*Primary Examiner*—Thi Dang
*Assistant Examiner*—Luz L. Alejandro
*Attorney, Agent, or Firm*—Lowe Hauptman Gopstein Gilman & Berner

[57] ABSTRACT

A compact microwave downstream plasma system includes, within a significantly small portable housing unit, a power supply, a microwave generator, a non-linear waveguide, a circulator, a dummy load, a plasma applicator, and an igniter. The microwave generator supplies microwaves to the guide to the applicator. The guide includes several curved regions that allow for a more compact design. The applicator is configured to generate a plasma and output reactants that can be used to remove photoresist layers from a wafer within a process reactor.

60 Claims, 6 Drawing Sheets

COMPACT MICROWAVE DOWNSTREAM PLASMA SYSTEM

TECHNICAL FIELD

The present invention relates to systems and tools used in the fabrication of semiconductor devices on a work product, and more particularly to microwave downstream plasma systems, tools and methods for use in removing materials from the work product during the fabrication process.

BACKGROUND ART

There are several different means by which materials, such as photoresist, can be removed from a work product. The wet chemical stripping techniques that were used for many years have recently given way to dry stripping techniques or combinations of wet/dry stripping techniques. The dry stripping techniques typically include removing the resist materials by using reactants to burn off the organic materials in the resist at elevated temperatures. The reactants are often created by way of a plasma that is generated using one or more selected gases and a high energy source, such as a radio frequency (rf) or microwave energy source. For example, the plasma in a typical microwave downstream plasma system is arranged to produce a flux of radical species (i.e. reactants), such as, for example, atomic oxygen, which is then directed "downstream" to a process chamber and brought into contact with the work product. The work product is typically a semiconductor wafer on which a resist layer has previously been applied and patterned to form a mask.

A microwave downstream plasma system, such as that described above, is usually included in a fabrication facility along with other fabrication systems and tools, such as, for example, etching systems, ion implantation systems, and deposition systems. Within a typical fabrication facility there can be several stations, each having an assortment of systems or tools for use in the fabrication process. Moreover, the facility provides these stations/systems within a clean room environment to further reduce the chance of contaminants entering the work product.

The costs associated with providing and maintaining a fabrication facility having these types of systems are often very high. For example, it is not uncommon for new facilities to cost hundreds of millions, or even several billions of dollars to build. The operational costs for such a facility are often very high as well. As a result, there is a continuing need to provide more cost effective systems and tools that reduce these expenses while also providing state of the art processing capabilities.

SUMMARY OF THE INVENTION

The present invention provides cost effective apparatus, systems and tools that are more compact and as such reduce facility related expenses while also providing state of the art processing capabilities. Additionally, a modular design has been implemented to provide for easier access and maintenance. The present invention further provides improved methods for using the apparatus, systems and tools to fabricate devices on work products, such as, for example, semiconductor wafers.

In accordance with one embodiment of the present invention, there is provided a plasma generating apparatus for use with a downstream process reactor. The apparatus includes a generator, a guide and an applicator. The generator is configured to output microwave energy into a first end of the guide. The guide is configured to direct at least a portion of the microwave energy output by the generator from the first end towards a second end, which is coupled to the applicator. The guide further includes at least one curved region between the first end and the second end. The applicator is configured to generate a plasma, within the applicator, using at least a portion of the microwave energy provided via the guide. In some embodiments, the applicator has an igniter, such as, for example, an ultraviolet energy source that assists in striking the plasma.

In certain embodiments, the guide has a tuner that is coupled between the first end and the second end. The tuner is configured to control at least one parameter, such as, for example, an amplitude, a frequency, or a phase, associated with the microwave energy within the guide. In other embodiments, the guide has an attenuating mechanism that is also coupled between the first end and the second end. This attenuating mechanism is configured to substantially attenuate microwave energy traveling towards the first end within the guide. Also, in some embodiments the guide includes a plurality of segments that are connected together, however, in these embodiments at least two of the plurality of segments are connected together without using a flange connector. For example, the two segments can be bonded together with a weld or a bonding material.

In another embodiment of the present invention, the apparatus further includes a power supply that is coupled to the generator and configured to supply electrical energy to the generator for use in outputting microwave energy. In certain embodiments, the power supply has been divided into separate subsystems. The subsystems can include, for example, a controller, a bus, and/or an inverter.

The apparatus in still other embodiments includes a housing that is configured to support at least the generator, the guide and the applicator. In certain embodiments, the housing has a mounting bracket that is suitable for pivotally mounting the apparatus to an external apparatus.

The above stated needs and others are further met by a downstream stripping tool for use in fabricating a semiconductor device on a work product. The tool includes a reactant generating arrangement that includes a generator, a guide and an applicator. In this embodiment, the generator supplies microwave energy to the guide, the guide directs the microwave energy through at least one curved region and provides at least a portion of the microwave energy to the applicator for use in generating a plasma within the applicator. The plasma causes at least one reactant to be supplied to a processing arrangement that is coupled to the reactant generating arrangement and configured to receive the reactant and direct the reactant to an exposed portion of the work product. In certain exemplary embodiments, the reactant generating arrangement further includes a housing that is configured to support at least the generator, the guide and the applicator. In other embodiments, the housing is also pivotally mounted to the processing arrangement.

A modular plasma source is also provided in yet another embodiment of the present invention. The modular plasma source can be used with a downstream process reactor. The modular plasma source has a footprint of less than approximately 576 square inches based the product of a maximum width measurement and a maximum depth measurement. In this embodiment, the maximum width and depth measurements are for an operatively configured modular plasma source. The modular plasma source includes, within the footprint, a power supply, an applicator and a microwave generator. The microwave generator is electrically coupled to the power supply and arranged to supply microwave energy to the applicator. In one embodiment, the modular plasma source has a maximum height measurement of less than approximately 36 inches. Also, in other embodiments, the modular plasma source further includes a tuner coupled between the microwave generator and the applicator, a circulator coupled between the microwave generator and the applicator and a dummy load coupled to the circulator, and/or an igniter that is configured to ignite a plasma within the applicator.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENTS

One important factor in reducing the costs associated with a fabrication facility is the physical requirements of the systems and tools that are to operate within the facility structure. By way of example, the physical requirements can include the size, weight, thermal characteristics, and noise/vibration of the system/tool. The size of the tool, for example, can increase the facility costs by requiring that more space be provided for the tool. Thus, reducing the footprint of a system or tool usually lowers the facility costs associated with the system/tool. Designers of fabrication facilities, systems and tools have had great success in reducing the footprints of many systems and tools, and as such have significantly reduced costs and increased throughput. For example, designers have continued to reduce the footprints of the transport and processing systems/modules to save space within the facility. Indeed, for many facilities, reduction of the space required for the transport and process modules has been a high priority goal in the pursuit of the optimal use of available space. Because the footprint of the aforementioned modules has been the determining factor, efforts to reduce footprints have been directed towards these modules in the prior art.

Figure 1:
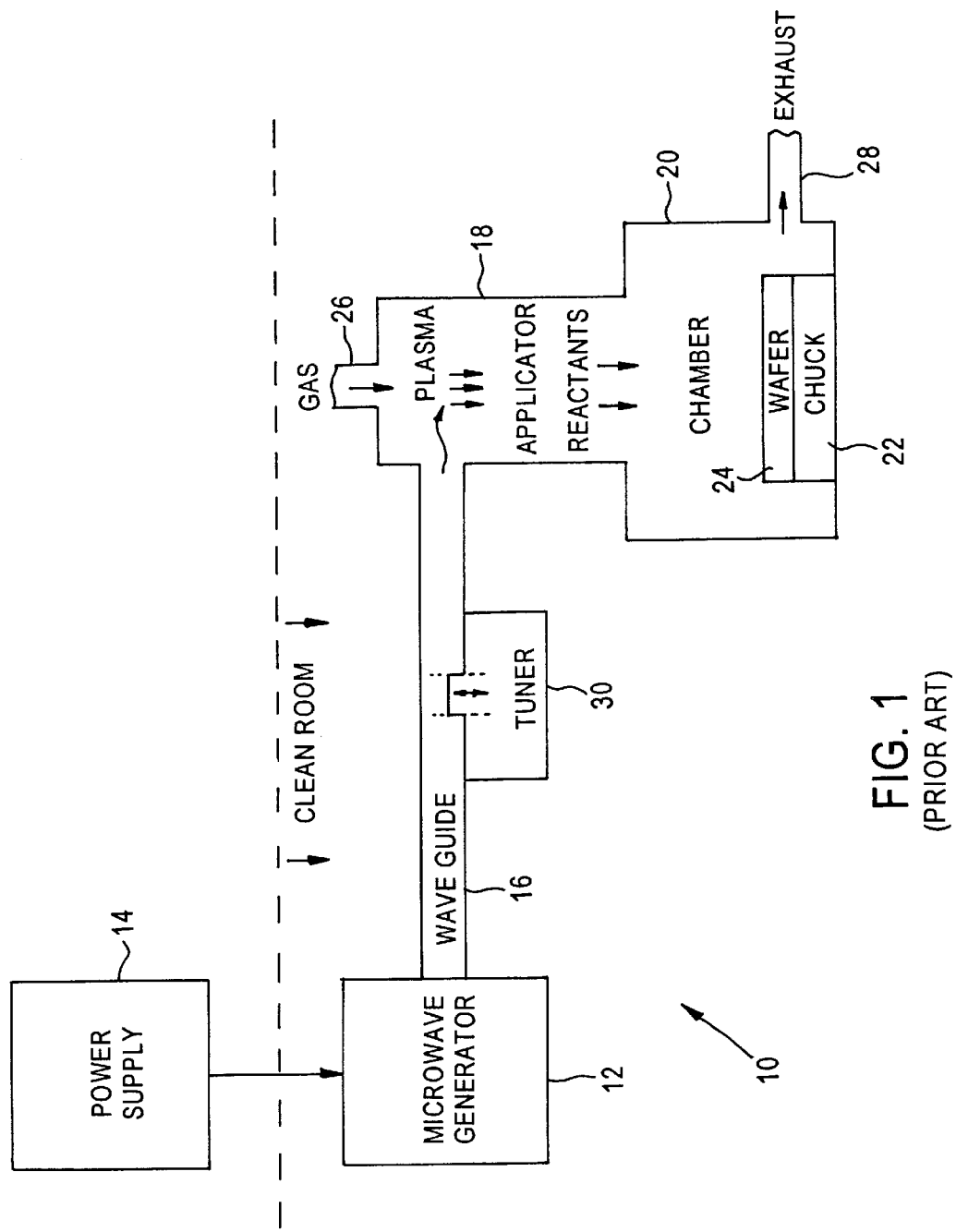
FIG. 1 is a schematic diagram of a conventional microwave downstream plasma system having an external power supply, and a substantially linear waveguide between a microwave generator and an applicator.

With this in mind, FIG. 1 is a block diagram depicting the major components of a microwave downstream plasma system 10, as currently found in many fabrication facilities. System 10, which is typically included in a station or used as a stand-alone tool, includes a microwave generator 12, an external power supply 14, a waveguide 16, an applicator 18, and a processing reactor chamber 20. Within processing reactor chamber 20, there is shown a chuck 22 and a wafer 24 (i.e., the work product). Also shown is a gas inlet 26 leading into applicator 18 and an exhaust port 28 leading away from chamber 20. Microwave generator 12 is coupled to and powered by external power supply 14. Microwave generator 12 is arranged to output microwave energy through waveguide 16 and into applicator 18. Within applicator 18, the microwave energy is combined with one or more gases, as supplied within applicator 18 via inlet 26, to create a plasma that causes reactants to enter into chamber 20 and react with any resist materials on the exposed surfaces of wafer 24. Wafer 24 is positioned on chuck 22 during the stripping process. Chuck 22, which usually includes a mechanism (not shown) to hold wafer 24, is typically heated to raise the temperature of wafer 24 to further the resist stripping process.

As shown, waveguide 16 usually includes a tuner 30 that is used to adjust the phase, or some other parameter, associated with the microwave energy provided to applicator 18 to allow for, or enhance, the plasma generated within applicator 18. Tuner 30, which can be automatically or manually adjustable, typically includes a mechanism for arranging one or more rods within waveguide 16 that interact with the microwaves to provide the desired parameter adjustment.

System 10, while providing state of the art stripping capabilities, suffers from a rather large footprint due to several design features. First, power supply 14, which is often very large and bulky (e.g., 4–6 cubic feet), is typically located within a separate electrical rack either within the clean room, or external to the clean room (as shown), to reduce the footprint of system 10 about a station within the clean room. This, however, often leads to additional costs, for example, due to cabling and critical floor space. Secondly, in order to strike a plasma within applicator 18, waveguide 16 typically needs to be long enough to allow for tuner 30 to adjust the microwave energy to maximize the power provided to the gas(es) within applicator 18. Thus, in the past, waveguide 16 has been a significantly long and linear four-sided waveguide connected between microwave generator 12 and applicator 18. This long, linear arrangement tends to require additional space within the facility.

Additionally, the separation of components, such power supply 14, and the length and linear arrangement of waveguide 16 tend to increase operating expenses by requiring additional labor and time to troubleshoot, repair and/or maintain system 10. By way of example, repair of power supply 14 because of a malfunction in the power supply, requires a significant amount of time. As depicted in FIG. 1, to gain access to power supply 14 the systems operator would have to leave the clean room to check the status of the power supply, and/or a second operator would be required. As a further example, to gain access to chamber 20 to conduct routine cleaning/maintenance, the fixed or rigid structure of waveguide 16 combined with microwave generator 12 and applicator 18 typically needs to be disassembled. This can lead to additional downtime for the system and increased operation and maintenance costs.

Thus, in accordance with an embodiment of the present invention, the footprint of a microwave downstream plasma system has been significantly reduced by providing a compact microwave downstream plasma source that provides state of art stripping capabilities. In accordance with the present invention, the compact downstream plasma source is provided in a single unit or housing that can be easily lifted, removed and/or replaced within the clean room. Being self-contained and readily portable, the compact downstream plasma source tends to reduce maintenance costs and the related down time by providing a "plug-and-play" type of component. This plug-and-play feature is especially useful in minimizing the downtime required to exchange units as part of a preventive or corrective maintenance procedure, and/or as part of an upgrade cycle from one type of system or generation to another. Furthermore, being a substantially self-contained unit, there is no need for external space or additional electrical racks.

Figure 2:
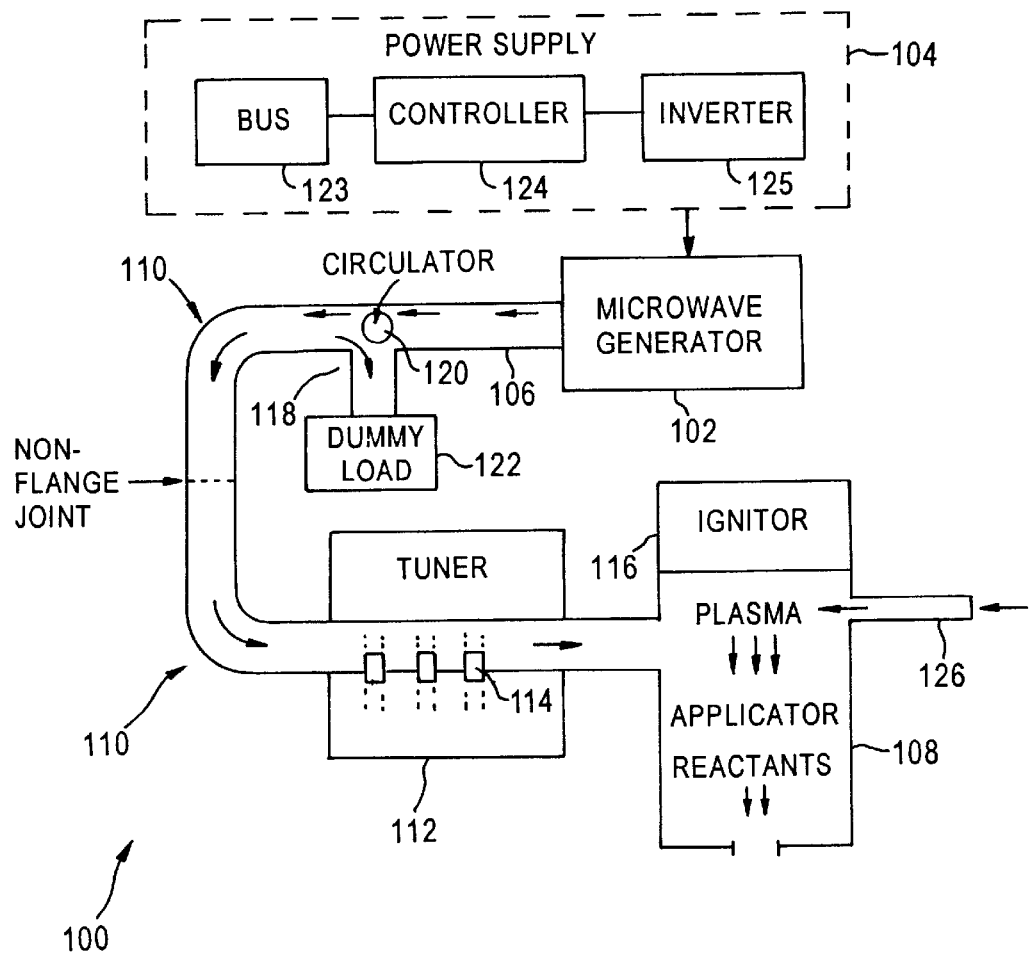
FIG. 2 is a schematic diagram of a compact microwave downstream plasma source having an on-board power supply, and a waveguide that includes curved regions between a microwave generator and an applicator, in accordance with an embodiment of the present invention.

FIG. 2 is a block diagram depicting a compact downstream plasma source 100 in accordance with an embodiment of the present invention. Compact downstream plasma source 100 includes a microwave generator 102, an on-board power supply 104, a non-linear waveguide 106, and an applicator 108. Waveguide 106 includes at least one substantial bend or curved region 110 that redirects the microwave energy generated by microwave generator 102 towards applicator 108. As shown, waveguide 106 further includes a automatic tuner 112 and an attenuating mechanism 118 that, in one embodiment of the present invention, includes a circulator 120 and a dummy load 122.

Power supply 104 supplies power to microwave generator 102 to control the microwave energy supplied by microwave generator 102 to waveguide 106. In one embodiment of the present invention, power supply 104 monitors and compensates for changes in the output of microwave generator 102 during operation. As such, power supply 104 includes several functional subsystems or circuits that, in certain embodiments, have been advantageously separated (physically) to further enhance the compactness of source 100.

For example, in a preferred embodiment of the present invention, power supply 104 has been divided into three subsystems (see FIG. 2), namely a bus 123, a controller 124 and an inverter 125. Bus 123 is configured to receive an outside alternating current (AC) power, and convert and/or distribute the AC power to controller 124 and inverter 125. For example, in accordance with a preferred embodiment of the present invention, the AC power is derived from a 208 V AC, 3-phase source that is provided to bus 123. Bus 123 provides one phase to controller 124 and further rectifies/conditions the 208 V AC to provide 300 V direct current (DC) power to inverter 125. Inverter 125 includes switched power transistors that are arranged to a produce 600 V AC (peak-to-peak) power that is then supplied to a high voltage transformer to produce a 4000 V AC (peak-to-peak) power which is then rectified/conditioned to 4000 V DC power. The resulting 4000 V DC power is preferably capable of supplying up to approximately 600 mA to microwave generator 102. The switching of the transistors within inverter 125 is controlled via logic within controller 124 in response to selected control inputs and monitored performance parameters associated with microwave generator 102. Thus, controller 124 essentially controls the current supplied to microwave generator 102 by inverter 125.

Microwave generator 102 generates microwave energy and outputs the microwave energy to waveguide 106. In a preferred embodiment of the present invention, microwave generator 102 is a magnetron capable of outputting approximately 125 to 1500 Watts at a frequency of approximately 2.45 GHz±15 MHz with less than 1% ripple. By way of example, power supply 104 (as described above) and microwave generator 102 (e.g., a forward power magnetron head) are both available from Applied Science and Technology, Inc. (ASTeX™), of Woburn, Mass.

Waveguide 106, which is arranged to direct the microwave energy from microwave generator 102 to applicator 108, is preferably a single integrated unit that includes a four-sided structure or other suitable medium to guide the microwave energy to applicator 108. In other embodiments, waveguide 106 includes two or more sections that are arranged to serve as the medium. Unlike the linear waveguides in previous systems, waveguide 106 includes at least one significantly curved region 110. For example, as depicted in FIG. 2, a curved region 110 provides a 90 degree bend. It is recognized that other angles can be used and/or combined over a distance to direct the microwave energy from microwave generator 102 to applicator 108.

Contrary to the design of waveguide 16 in FIG. 1, non-linear waveguide 106, which is essentially bent or folded, effectively reduces the footprint of the system/tool. Thus, waveguide 106 can be just as long, or longer than waveguide 16 without occupying as much space within the clean room. Additionally, waveguide 106, in a preferred embodiment of the present invention, is actually shorter than a conventional waveguide 16. However, additional efforts may be required to initiate and control the plasma within applicator 108 due to the shortened length of waveguide 106. One way to compensate for the shorted length is to provide a state of the art tuner 112 that effectively enables source 100 to stay within the process window specified for a given work product process.

Thus, in accordance with an embodiment of the present invention, tuner 112 is preferably an automatic load matching device that includes a closed-loop control circuit, with power sensors (not shown) and attenuators 114. Tuner 112 is preferably located along waveguide 106 between microwave generator 102 and applicator 108. The control circuit within tuner 112, in one embodiment, includes three sensors, separated by 60 degree increments associated with the microwaves within waveguide 106, that detect both the applied power from microwave generator 102 and the reflected power from the plasma within applicator 108. When the sensors detect reflected power, their output is fed to the control circuit in tuner 112 that provides corrective signals to three stepper motors which control the positioning of attenuators 114 within waveguide 106. Attenuators 114 are preferably stubs that are also positioned in 60 degree increments (similar to the sensors above) to selectively attenuate the top half (i.e., 180 degrees) of the microwaves within waveguide 106. This attenuation is then inherently reproduced in the bottom half of the microwaves also. When attenuators 114 are properly set, the reflected power is substantially eliminated and the supplied power significantly matches the load in applicator 108. Thus, during the initial ignition of the plasma within applicator 108, and/or in response to changes in the stripping recipe, the control circuit within tuner 112 matches the applied power of the microwave energy within waveguide 106 to the load. By way of example, in a preferred embodiment of the present invention, tuner 112 is a SmartMatch™ autotuning system available from ASTeX™.

Attenuating mechanism 118, which is optional, is provided to remove microwaves that travel within waveguide 106 back towards, (i.e., reflected toward) microwave generator 102. In a preferred embodiment, attenuating mechanism includes circulator 120 that uses magnetic fields to redirect these microwaves towards dummy load 122. Dummy load 122 is configured to absorb the redirected microwaves. Circulator 120 and dummy load 122 are available from ASTeX™.

Applicator 108 preferably has an elongated tube, for example a quartz or sapphire tube, that has been configured to receive one or more gases through inlet 126, maintain a specified pressure, and receive the tuned microwave energy from waveguide 106. Applicators, such as this, and their operation, are known to those skilled in the art. Applicator 108 is preferably a water cooled applicator that is also available from ASTeX™.

In accordance with an embodiment of the present invention, inlet 126 and the gas flowing through it are heated with a resistive heating element (not shown) that is wrapped about inlet 126 and controlled to maintain inlet 126 and the gas(es) therein at a specified temperature to assist in the stripping process. For example, if inlet 126 is a metallic pipe and the gases supplied to applicator 108 include vaporized $H_2O$, then the temperatures of inlet 126 and the gases therein are maintained sufficiently high enough to prevent possible water condensation within inlet 126 which could have deleterious affects on the process, equipment, and/or work product.

In one embodiment, applicator 108 further includes an igniter 116 that is used to strike the plasma during initiation. For example, igniter 116, in an exemplary embodiment is an ultraviolet light source. Thus, igniter 116 allows for quick plasma generation, and in certain embodiments further overcomes any potential plasma ignition/control difficulties presented by a shortened length of waveguide 106.

Figure 3:
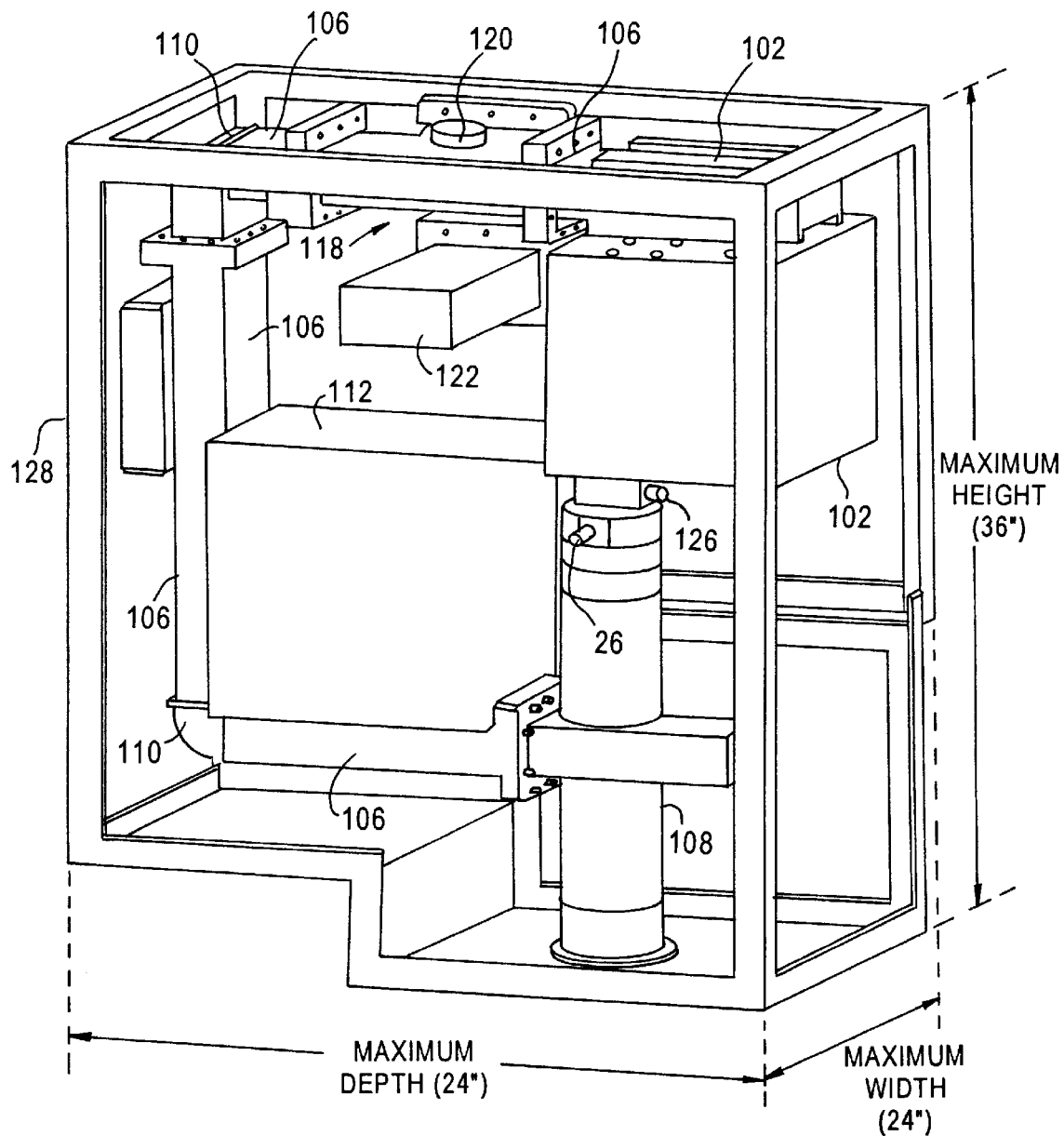
FIG. 3 is a perspective diagram of a cabinet having its side panels removed, wherein the cabinet includes is a compact microwave downstream plasma source as in FIG. 2, in accordance with one embodiment of the present invention.

Cabinet 128, illustrated in FIG. 3 with its side panels removed, contains microwave source 102, power supply 104, waveguide 106, circulator 120, dummy load 122, tuner 112, applicator 108 and its igniters 116, as well as gas inlet 126, and has a small footprint. The arrangement of the components within cabinet 128 is exemplary and additional arrangements exist within the scope of the present invention.

Thus, in accordance with an embodiment of the present invention, cabinet 128 essentially defines the preferred size for a modular plasma source for use with a downstream process reactor. As shown, in this embodiment, cabinet 128 has a maximum footprint of less than approximately 576 square inches based the product of a maximum width measurement (24 inches) and a maximum depth measurement (24 inches). The maximum width and depth measurements are for an operatively configured modular plasma source. Additionally, although not as important, a preferred embodiment of cabinet 128 also has a maximum height measurement of less than approximately 36 inches.

The values listed above represent maximum preferred measurements based, in part, on particular installation characteristics/requirements. It is therefore recognized that these values can fluctuate depending upon the station and facility. In a preferred embodiment, for example, the maximum width and depth can vary, independently, down to approximately 14 inches, or less, depending on the positioning and/or subdivision of the various components within cabinet 128. By way of example, power supply 104 in certain embodiments has been physically divided into a plurality of subsystems (as described above) that are then strategically positioned within cabinet 128 to reduce the dimension(s) as required for a specific installation. Furthermore, it is recognized that, by folding or bending the waveguide and/or subdividing the power supply or other control/monitoring devices into a plurality of units, source 100 can be arranged in a advantageously compact form without requiring a housing unit.

Figure 4:
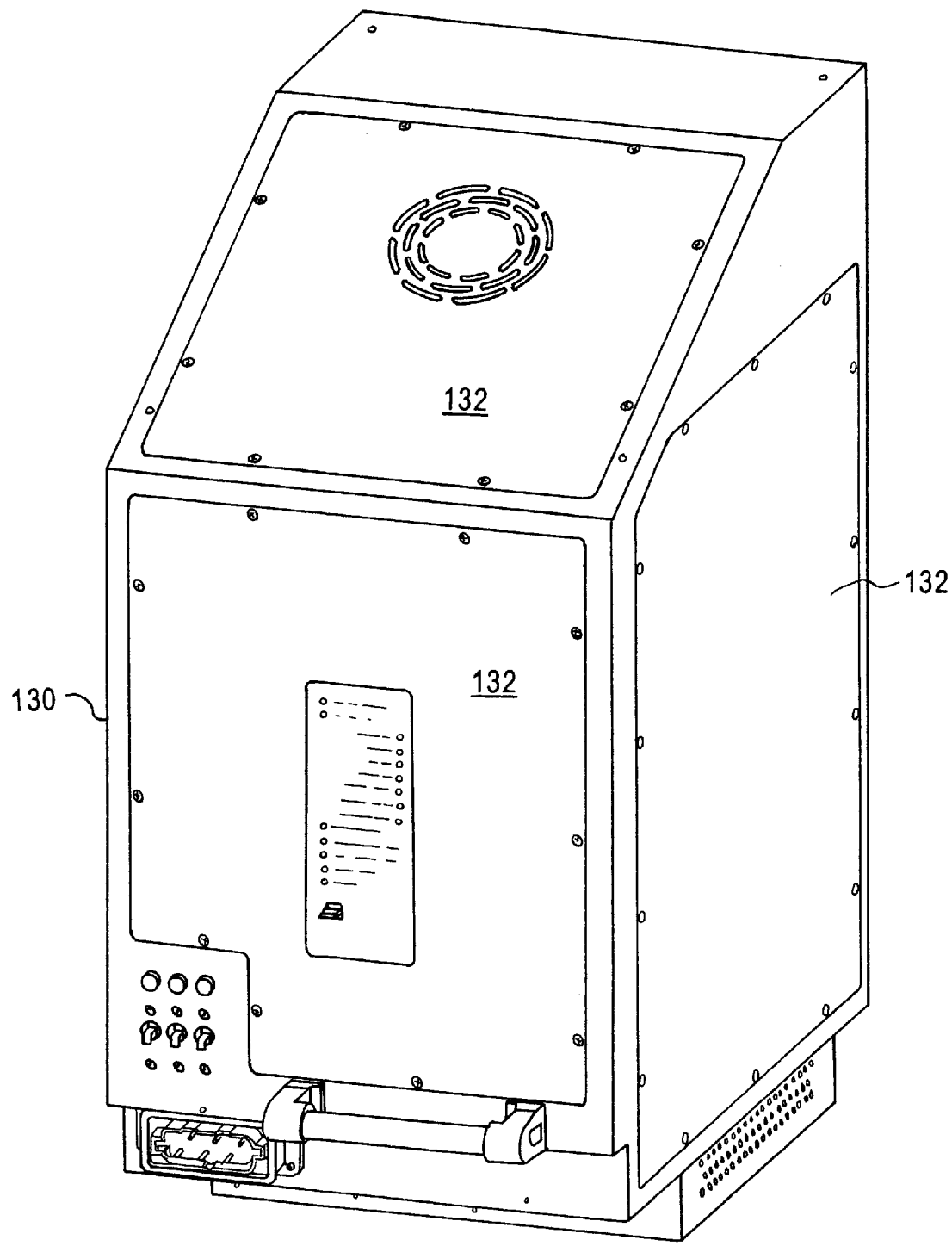
FIG. 4 is a perspective diagram of a cabinet in FIG. 3 having attached, removable side panels, that contains a compact microwave downstream plasma source, in accordance with one embodiment of the present invention.

FIG. 4 is a perspective view of an exemplary cabinet 130, having attached side panels 132. A compact microwave downstream plasma source as in FIG. 2, in accordance with one embodiment of the present invention, is included within cabinet 130. In this embodiment, the external connections include AC power connector, gas(es) connector(s), cooling water in/out, and control input/output port(s). Cabinet 130, in a preferred embodiment, has a maximum width of approximately 14 inches, a maximum depth of approximately 21 inches, a maximum height of approximately 30 inches, and a weighs approximately 166 pounds.

Figure 5:
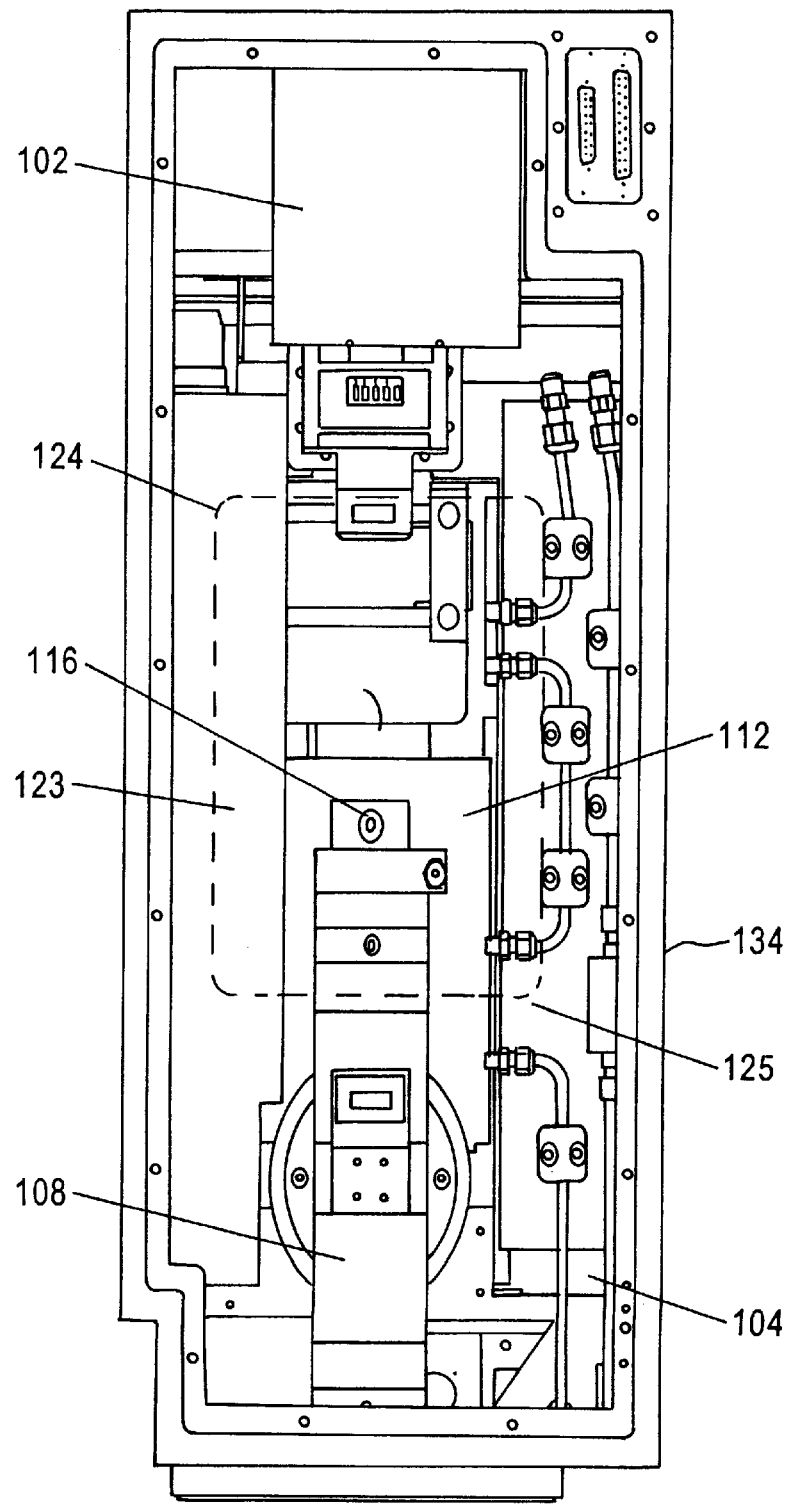
FIG. 5 is a back-side view of an exemplary housing unit, having its back-side panel removed, that contains a compact microwave downstream plasma source, in accordance with one embodiment of the present invention.

FIG. 5 is a back-side view of an exemplary cabinet 134, in accordance with one embodiment of the present invention, having its back-side panel removed to reveal several of the visible components of the compact microwave downstream plasma source 100. In this embodiment, for example, power supply 104 has been subdivided into the three subsystems depicted in FIG. 2, above. Each of these subsystems (i.e., bus 123, controller 124 and inverter 125) is then positioned within cabinet 134, along a side. For example, bus 123 is positioned along the left-hand side (as shown, from the back side), inverter 125 is positioned along the right-hand side, controller 124 (depicted as a dashed box) is similarly positioned along the front side, within cabinet 134. As shown, by simply removing a panel, access is provided to a plurality of internal devices and apparatus. Thus, in accordance with an embodiment of the present invention, serviceability is enhanced by adding side panels, doors, or the like to provide quick access to the internal structure of source 100.

In accordance with an embodiment of the present invention, a plurality of interlock mechanisms has also been provided to promote personnel and equipment/work product safety. Unlike system 10 in FIG. 1, source 100, and in particular exemplary housing units 128, 130 and 134, have power supply 104 within close proximity to cooling water inlet 126 (that may carry $H_2O$ vapors), and the operators. As such, interlocking devices and logic have been included to reduce the chance of an accident occurring. By way of example, a water detector has been provided within cabinet 134 to detect the presence of water therein. When water is detected, the power is shut off via controller 124 or another safety circuit. Additional interlocks detect when side panels have been removed, or are not properly secured, and shut the power off. In one embodiment, an interlock shuts off the power when housing unit 134 is tilted or otherwise positioned in a non-operative position.

Figure 6:
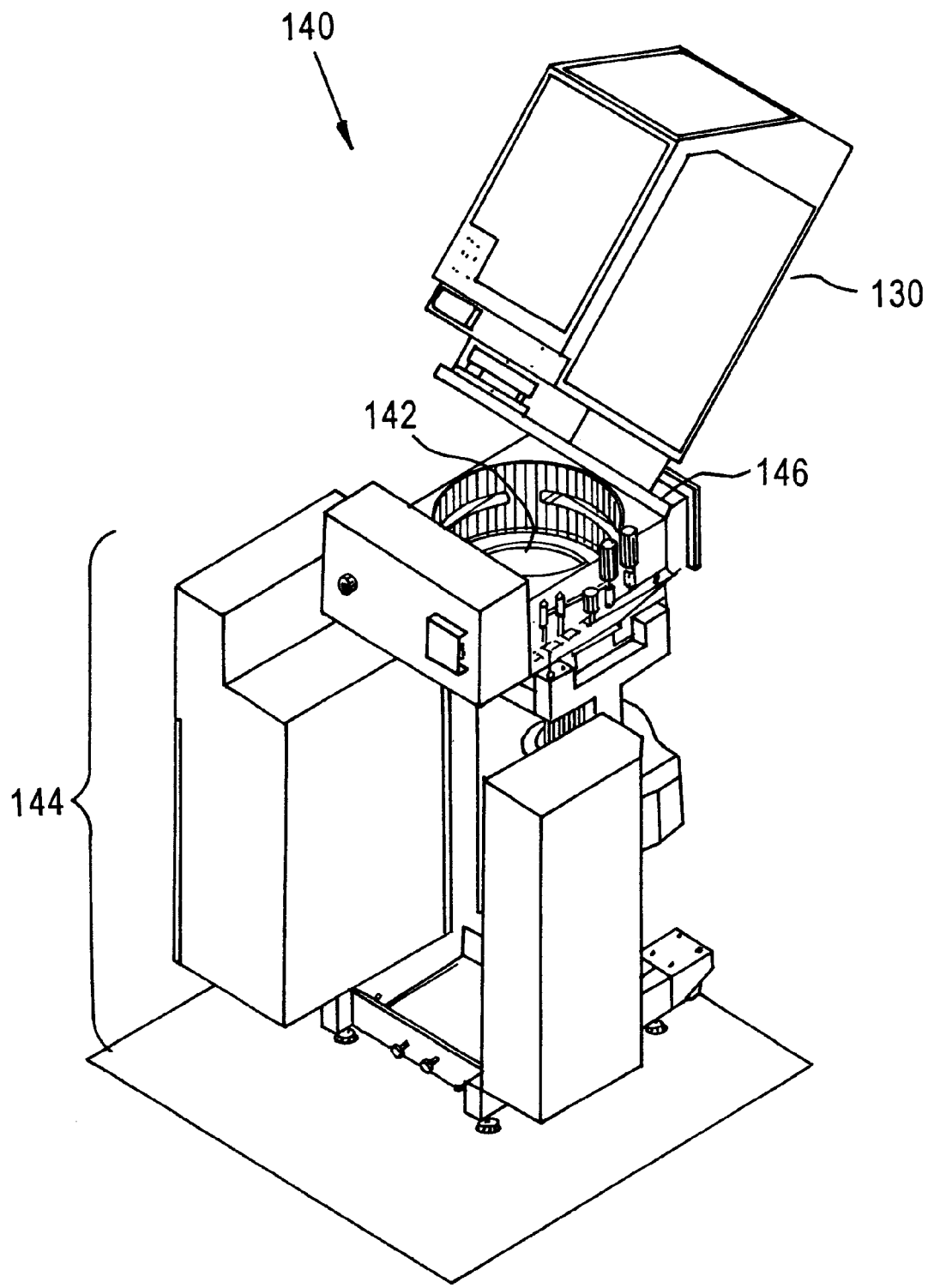
FIG. 6 is a perspective view of another embodiment of a microwave downstream plasma system that includes a process reactor within a base arrangement and a compact microwave down stream plasma source within a housing that is pivotally secured to the base arrangement, in accordance with an embodiment of the present invention.

FIG. 6 is a perspective view of a microwave downstream plasma system 150 that includes a process reactor 142 within a supporting base arrangement 144 and a compact microwave down stream plasma source 100 within a cabinet 130 that is pivotally secured at point 146 to base arrangement 144, in accordance with an embodiment of the present invention. As shown, plasma system 150 exhibits a significantly reduced footprint due to the size of microwave down stream plasma source 100 within cabinet 130. Moreover, as depicted access to the chamber in process reactor 142 does not require disassembly of any of the components within microwave down stream plasma source 100. Instead, cabinet 130 is simply disconnected, if required, from power, water, data, etc. connections, unsecured from base arrangement 144 and tilted or otherwise pivoted to expose reactor 142. Furthermore, by disconnecting the pivoting mechanism at point 146, the entire cabinet 130 and microwave down stream plasma source 100 can be removed. This allows for quick replacement of microwave down stream plasma source 100 with very little downtime.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A plasma generating apparatus for use with a downstream process reactor, the apparatus comprising:
    a cabinet;
    a generator configured to output microwave energy;
    a guide having a first end and a second end, the first end being coupled to the generator, the guide being configured to direct at least a portion of the microwave energy output by the generator from the first end to the second end, the guide including at least one curved region between the first end and the second end; and
    an applicator coupled to the second end of the guide and configured to generate a plasma, within the applicator, using at least a portion of the microwave energy as directed by the guide from the first end to the applicator;
    the generator, guide and applicator being located in and supported by the cabinet.

2. The apparatus as recited in claim 1, wherein the guide further includes a tuner coupled between the first end and the second end, and wherein the tuner is configured to control at least one parameter associated with the microwave energy within the guide, the tuner being located in and supported by the cabinet.

3. The apparatus as recited in claim 2, further comprising a power supply coupled to the generator and configured to supply electrical energy to the generator for use in outputting microwave energy, the power supply being located in and supported by the cabinet.

4. The apparatus as recited in claim 3, wherein the power supply further includes at least two separate subsystems selected from the set of a controller, a bus, and an inverter.

5. The apparatus as recited in claim 2, wherein the guide further includes an attenuating mechanism coupled between the first end and the second end, and wherein the attenuating mechanism is configured to substantially attenuate microwave energy traveling towards the first end within the guide, the attenuating mechanism being located in and supported by the cabinet.

6. The apparatus as recited in claim 5, wherein the attenuating mechanism includes a circulator and a dummy load, wherein the circulator is configured to redirect microwave energy traveling towards the first end within the guide to the dummy load, and wherein the dummy load is configured to absorb the redirected microwave energy, the circulator and dummy load being located in and supported by the cabinet.

7. The apparatus as recited in claim 2, wherein the parameter associated with the microwave energy in the guide is selected from a group of parameters including an amplitude, a frequency, and a phase.

8. The apparatus as recited in claim 1, wherein the applicator further includes an igniter that is configured to ignite the plasma within the applicator, the igniter being located in and supported by the cabinet.

9. The apparatus as recited in claim 8, wherein the igniter includes an ultraviolet energy source.

10. The apparatus as recited in claim 1, wherein the cabinet is further configured to support a power supply having at least one subsystem selected from the set of a controller, a bus, and an inverter.

11. The apparatus as recited in claim 1, wherein the cabinet further includes a mounting bracket for pivotally mounting the apparatus to an external apparatus.

12. The apparatus as recited in claim 1, wherein the guide includes a plurality of segments that are connected together, and wherein at least two of the plurality of segments are connected together without a flange connector.

13. The apparatus as recited in claim 1, wherein the guide includes a plurality of curved regions between the first end and the second end.

14. The apparatus as recited in claim 1, wherein the generator, the guide and the applicator are arranged to be connected and disconnected from a second apparatus without requiring additional assembly and disassembly of the generator, the guide and the applicator.

15. The plasma generating apparatus of claim 1 wherein the applicator includes an outlet port for the generated plasma, the outlet being adjacent an exterior surface of the cabinet, the outlet port being arranged for connection to a plasma inlet of the downstream processor reactor.

16. A downstream stripping tool for use in fabricating a semiconductor device on a work product, the tool comprising:
    a cabinet including and supporting:
    a reactant generating arrangement that includes a generator, a guide, and an applicator, the generator including a connection for supplying microwave energy to the guide, the guide being arranged for directing the microwave energy through at least one curved region and supplying at least a portion of the microwave energy to the applicator for use in generating a plasma within the applicator and outputting at least one reactant; and
    a plasma processor, coupled to the reactant generating arrangement, and configured to receive the reactant and direct the reactant to an exposed portion of a workpiece in the processor.

17. The tool as recited in claim 16, wherein the guide further includes a tuner coupled between the generator and the applicator, wherein the tuner is configured to control at least one parameter associated with the microwave energy within the guide, the tuner being located in and supported by the cabinet.

18. The tool as recited in claim 17, wherein the reactant generating arrangement further includes a power supply, coupled to the generator, and configured to supply electrical energy to the generator for use in outputting microwave energy, the power supply being located in and supported by the cabinet.

19. The tool as recited in claim 17, wherein the reactant generating arrangement further includes a controller coupled to the generator and configured to control the outputting of microwave energy from the generator, the controller being located in and supported by the cabinet.

20. The tool as recited in claim 17, wherein the guide further includes an attenuating mechanism, coupled between the generator and the applicator, the attenuating mechanism being configured to substantially attenuate microwave energy traveling towards the generator within the guide, the attenuating mechanism being located in and supported by the cabinet.

21. The tool as recited in claim 17, wherein the applicator further includes an igniter that is configured to ignite the plasma within the applicator, the igniter being located in and supported by the cabinet.

22. The tool as recited in claim 16, wherein the cabinet is pivotally mounted to the processor.

23. The tool as recited in claim 16, wherein the guide includes a plurality of curved regions.

24. The tool as recited in claim 16, wherein the reactant generating arrangement is arranged to be connected and disconnected from the processing arrangement without requiring additional assembly and disassembly of the generator, the guide and the applicator within the reactant generating arrangement.

25. The downstream stripping tool of claim 16 wherein the applicator includes an outlet port for the generated plasma, the outlet being adjacent an exterior surface of the cabinet, the outlet port being arranged for connection to a plasma inlet of the processor.

26. A modular plasma source for use with a downstream process reactor, the modular plasma source comprising: a cabinet having a square footprint of less than approximately 576 square inches based on the product of a maximum width measurement and a maximum depth measurement, the cabinet including within the footprint: (a) a power supply connected to be responsive to an AC power source for deriving power supply voltage for a microwave source, (b) an applicator for supplying plasma to the downstream process reactor, and (c) a microwave generator electrically connected to be responsive to the power supply voltage and arranged to supply microwave energy to the applicator.

27. The modular plasma source as recited in claim 26, further having a maximum height measurement of less than approximately 36 inches.

28. The modular plasma source as recited in claim 26, further including at least one additional component selected from a set of:
a tuner coupled between the microwave generator and the applicator;
a circulator coupled between the microwave generator and the applicator and a dummy load coupled to the circulator, wherein the circulator is configured to direct microwave energy traveling towards the microwave generator to the dummy load, and wherein the dummy load is configured to absorb microwave energy; and
an igniter that is configured to ignite a plasma within the applicator, the tuner, circulator and igniter being located in and carried by the cabinet.

29. The modular plasma source of claim 26 wherein the applicator includes an outlet port for a generated plasma, the outlet being adjacent an exterior surface of the cabinet, the outlet port being arranged for connection to a plasma inlet of the downstream processor reactor.

30. A microwave plasma source for supplying plasma to a plasma workpiece processor comprising a cabinet, the cabinet including: (a) a power bus adapted to be connected to a power source; (b) circuitry responsive to the bus for deriving a DC power supply voltage for a microwave source; (c) a microwave source connected to be responsive to the DC power supply voltage derived by the circuitry; (d) a microwave plasma applicator for deriving microwave plasma to be supplied to workpieces; and (e) a waveguide connected between the microwave source and the plasma applicator for supplying microwave energy from the microwave source to the plasma applicator.

31. A microwave plasma source according to claim 30 wherein the waveguide includes a bend.

32. A microwave plasma source according to claim 30 wherein the waveguide includes plural bends.

33. A microwave plasma source according to claim 30 wherein the cabinet is shaped as a box having substantially straight sides and a base having an area no greater than about 576 square inches based on the product of a maximum width measurement and maximum depth measurement.

34. A microwave plasma source according to claim 33 wherein the base has a substantially square shape.

35. A microwave plasma source according to claim 33 wherein the box has a height no greater than about 36 inches.

36. A microwave plasma source according to claim 33 wherein the waveguide has plural bends and longitudinally extending portions at side walls of the box.

37. A microwave plasma source according to claim 36 wherein different parts of the circuitry are in spaced different parts of the cabinet.

38. A microwave plasma source according to claim 30 wherein different parts of the circuitry are in spaced different parts of the cabinet.

39. A microwave plasma source according to claim 38 wherein the circuitry includes a first AC to DC converter connected for driving a DC to AC converter and a second AC to DC converter connected to be responsive to the DC to AC converter, at least one of the converters being in a different part of the cabinet from another of the other converters.

40. A microwave plasma source according to claim 30 wherein the cabinet includes a microwave tuner connected for electromagnetic coupling with the waveguide.

41. A microwave plasma source according to claim 40 wherein the cabinet includes a microwave component connected for electromagnetic coupling with the waveguide for substantially preventing reflected microwave energy.

42. A microwave plasma source according to claim 41 wherein the waveguide includes different portions connected to each other by joints that do not include flanges.

43. The plasma source of claim 40 wherein the cabinet includes parallel first and second substantially straight exterior surfaces and third, fourth, fifth and sixth substantially straight exterior surfaces extending in planes substantially at right angles to the first and second surfaces, the third and fourth surfaces being substantially parallel to each other and at substantially right angles to the fifth and sixth surfaces, the fifth and sixth surfaces being substantially parallel to each other, the microwave source being in a first housing adjacent a first corner of the cabinet defined by an intersection of the first, third, fourth and fifth surfaces, the tuner being in a second housing adjacent a second corner of the cabinet defined by an intersection of the second, third, fourth and sixth surfaces, the waveguide having; (a) a first portion longitudinally extending substantially straight from a connection to the microwave source parallel to and adjacent the first surface to a third corner of the cabinet defined by an intersection of the first, third, fourth, and sixth surfaces, (b) a first bend adjacent the third corner, (c) a second longitudinally extending substantially straight portion extending parallel to and adjacent the sixth surface, (d) a second bend adjacent the second corner, (e) a third longitudinally extending substantially straight portion extending parallel to and adjacent the second surface and connected to the second bend; the third portion having a connection to the applicator, the second portion having connections to the first and second bends, the applicator being in a third housing having a longitudinal axis extending substantially parallel to the third, fourth, fifth and sixth surfaces, the tuner being connected for electromagnetic coupling to one of the waveguide portions connected to the second bend.

44. The plasma source of claim 43 wherein at least some of the third, fourth, fifth and sixth surfaces include removable panels, which, when removed, provide access from outside the cabinet to the first, second and third housings.

45. The plasma source of claim 44 wherein edges of the third, fourth, fifth and sixth surfaces define a square.

46. The plasma source of claim 45 further including a dummy load in a fourth housing within the cabinet, the fourth housing being adjacent the first waveguide portion, the dummy load being connected to the first waveguide portion.

47. The microwave plasma source of claim 46 wherein the applicator includes an outlet port for the generated plasma, the outlet being adjacent the second surface of the cabinet, the outlet port being arranged for connection to a plasma inlet of the plasma workpiece processor.

48. A microwave plasma source according to claim 30 wherein the cabinet includes a microwave component connected for electromagnetic coupling with the waveguide for substantially preventing microwave energy from being reflected back to the microwave source.

49. A microwave plasma source according to claim 30 wherein the waveguide includes different portions connected to each other by joints that do not include flanges.

50. A microwave plasma source according to claim 30 wherein the applicator includes an elongated tube having an inlet for receiving gases that are adapted to be converted in the tube into the plasma.

51. A microwave plasma source according to claim 50 wherein the applicator includes an ignitor for the gases in the tube.

52. The microwave plasma source of claim 30 wherein the cabinet includes exterior removable panels and a base and each of the circuitry, microwave source and microwave plasma applicator is in a separate housing within the cabinet, each of the separate housings being located in close proximity to one of the panels to facilitate access to each of the housings when the panels are removed.

53. The microwave plasma source of claim 52 wherein the waveguide includes two longitudinally extending segments connected to each other at substantially right angles in proximity to a corner defined by a pair of said removable panels, each of said waveguide segments extending in a direction parallel to the panels forming the corner and being located in close proximity to said panels.

54. The microwave plasma source of claim 53 wherein the cabinet includes a microwave tuner connected for electromagnetic coupling with the waveguide, the tuner being in one of said housings within the cabinet.

55. The microwave plasma source of claim 54 wherein the cabinet includes a microwave component connected for electromagnetic coupling with the waveguide for substantially preventing reflected microwave energy, the microwave component for substantially preventing reflected microwave energy being located in close proximity to one of said panels.

56. The microwave plasma source of claim 55 wherein the applicator includes an elongated tube having an inlet for receiving gases that are adapted to be converted in the tube into the plasma, the applicator including an igniter for gases in the tube, the elongated tube and the igniter being located in close proximity to one of the panels.

57. The microwave plasma source of claim 30 wherein the cabinet includes a microwave tuner connected for electromagnetic coupling with the waveguide, the tuner being in a housing within the cabinet.

58. The microwave plasma source of claim 30 wherein the cabinet includes a microwave component connected for electromagnetic coupling with the waveguide for substantially preventing microwave energy from being reflected back to the microwave source, the microwave component for substantially preventing microwave energy from being reflected back to the microwave source being located in close proximity to an exterior removable panel of said cabinet.

59. The microwave plasma source of claim 30 wherein the applicator includes an elongated tube having an inlet for receiving gases that are adapted to be converted in the tube into the plasma, the applicator including an igniter for gases in the tube, the elongated tube and the igniter being located in close proximity to an exterior removable panel of said cabinet.

60. The microwave plasma source of claim 30 wherein the applicator includes an outlet port for the generated plasma, the outlet being adjacent an exterior surface of the cabinet, the outlet port being arranged for connection to a plasma inlet of the plasma workpiece processor.

* * * * *